United States Patent
Ahn et al.

(10) Patent No.: US 6,774,492 B2
(45) Date of Patent: Aug. 10, 2004

(54) CHIP PACKAGE ASSEMBLY HAVING CHIP PACKAGE MOUNTED ON PRINTED CIRCUIT BOARD

(75) Inventors: Moon Bong Ahn, Kyungki-do (KR);
Bang Won Oh, Kyungki-do (KR);
Kwang Cheol Cho, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 10/321,595

(22) Filed: Dec. 18, 2002

(65) Prior Publication Data
US 2003/0122231 A1 Jul. 3, 2003

(30) Foreign Application Priority Data
Dec. 27, 2001 (KR) .......................................... 2001-86345

(51) Int. Cl.[7] .............................................. H01L 23/48
(52) U.S. Cl. ...................... 257/774; 257/690; 257/692; 257/698; 257/701; 257/787
(58) Field of Search ................................ 257/696, 692, 257/698, 701, 773, 777, 787

(56) References Cited

U.S. PATENT DOCUMENTS

| | | | | |
|---|---|---|---|---|
| 5,554,887 A | * | 9/1996 | Sawai et al. | 257/787 |
| 5,990,546 A | * | 11/1999 | Igarashi et al. | 257/787 |
| 6,187,652 B1 | * | 2/2001 | Chou et al. | 257/698 |
| 6,611,039 B2 | * | 8/2003 | Anthony | 257/774 |

* cited by examiner

Primary Examiner—Gene M. Munson
(74) Attorney, Agent, or Firm—Lowe Hauptman Gilman & Berner LLP

(57) ABSTRACT

A chip package includes a chip having a first surface provided with a first terminal and a second surface provided with at least one second terminal, the second surface being opposite to the first surface, a first conductive layer formed on the first surface of the chip, a second conductive layer formed on the second surface of the chip, and a substrate attached to the second surface of the chip and including at least one conductive via hole connected to the second terminal of the chip. And the present invention provides a chip package assembly including the chip package. Further, a method of manufacturing the chip package and an assembly including the chip package are provided. The chip package does not use a bonding wire and additional conductive lands, thereby reducing the size of the package and simplifying the manufacturing process.

8 Claims, 7 Drawing Sheets

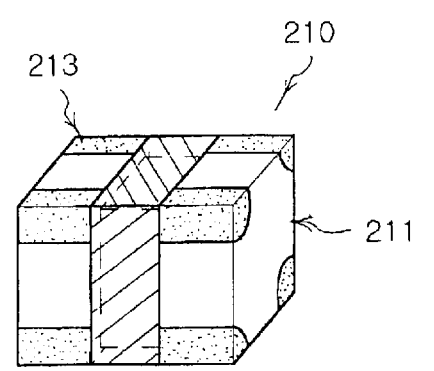
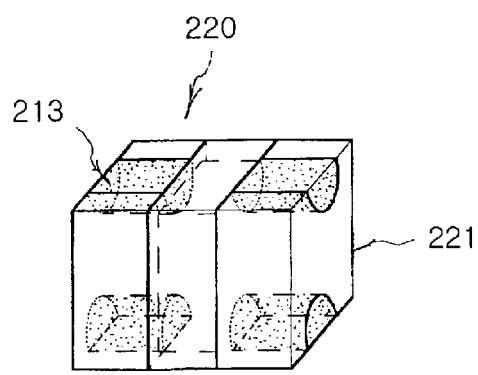
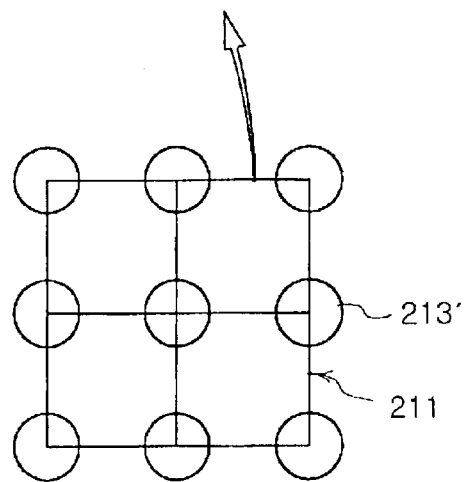
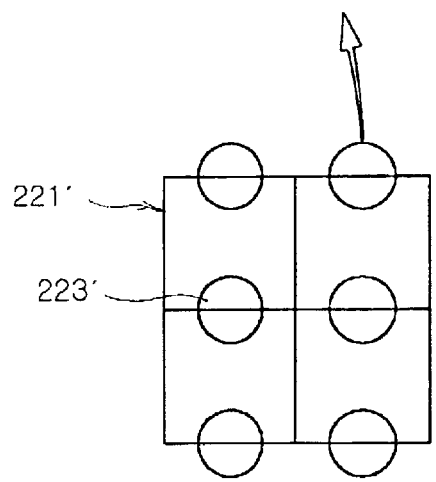
FIG. 7a
FIG. 7b

CHIP PACKAGE ASSEMBLY HAVING CHIP PACKAGE MOUNTED ON PRINTED CIRCUIT BOARD

BACKGROUND OF THE INVENTION

1. Field of the Invention

The present invention relates to the field of semiconductor manufacturing, and more particularly to a chip package, which is miniaturized and more simply manufactured by forming a conductive layer on both surfaces of a chip and by attaching a substrate provided with conductive via holes to one of these surfaces, and a method of manufacturing the chip package.

2. Description of the Related Art

As well known to those skilled in the art, semiconductor elements such as diodes or transistors are packaged and these packaged elements are then mounted on a printed circuit board. Structurally, this package easily connects terminals of the semiconductor chip to corresponding signal patterns of the printed circuit board and serves to protect the semiconductor chip from external stresses, thereby improving reliability of the package.

In order to satisfy recent trends of miniaturization of semiconductor products, the semiconductor chip packages also have been miniaturized. Therefore, a chip scale package has been introduced. FIG. 1 is a schematic cross-sectional view of a conventional chip scale package. The structure of the chip scale package 10 of FIG. 1 employs a ceramic substrate 1 and is applied to a diode with two terminals.

With reference to FIG. 1, two via holes, i.e., a first via hole 2a and a second via hole 2b, are formed on the ceramic substrate 1. The first and the second via holes 2a, 2b are filled with a conductive material so as to electrically connect the upper and the lower surfaces of the first and the second via holes 2a, 2b. Then, a first and a second upper conductive lands 3a, 3b are formed on the upper surfaces of the first and the second via holes 2a, 2b, respectively. A first and a second lower conductive lands 4a, 4b are formed on the lower surfaces of the first and the second via holes 2a, 2b, respectively. The second upper conductive land 3b is directly connected to a terminal formed on the lower surface of the diode 5, i.e., a mounting surface of the diode 5, on a printed circuit board, and the first upper conductive land 3a is connected to the other terminal formed on the upper surface of the diode 5 by a wire 7. A molding part 9 using a conventional resin is formed on the upper surface of the ceramic substrate 1 including the diode 5 in order to protect the diode 5 from the external stresses. Thereby, the manufacture of the package 10 is completed.

FIG. 2 is a schematic perspective view of a conventional chip package array.

As shown in FIG. 2, the manufactured chip package 10 is mounted on the printed circuit board 20 by a reflow soldering. The diode package 10 is electrically and mechanically connected to the printed circuit board 20 by arranging the upper conductive lands 3a, 3b and the lower conductive lands 4a, 4b of the package 10 on the corresponding signal patterns of the printed circuit board 20 and by then connecting the upper conductive lands 3a, 3b and the lower conductive lands 4a, 4b to the signal patterns with a solder 15.

As shown in FIGS. 1 and 2, since the diode usually has terminals on its two opposite surfaces, these terminals should be interconnected by wires. However, these wires require a rather large space on the upper surface of the chip, thereby increasing the overall height of the package. Further, since either two or three via holes, corresponding to the number of the terminals of the chip, are formed on the ceramic substrate, an area as large as the total diameters of the via holes is further required. Moreover, in order not to connect the conductive lands formed on the upper and the lower surfaces of the via holes to each other, the conductive lands are spaced from each other by a designated interval. Therefore, the size of the substrate imposes a limit in miniaturizing the package.

Accordingly, a packaging technique, which can minimize the size of the package and simplify its manufacturing process, has been demanded.

SUMMARY OF THE INVENTION

Therefore, the present invention has been made in view of the above problems, and it is an object of the present invention to provide a stable chip package, which is miniaturized, more simply manufactured and improves its reliability by forming a conductive layer on one surface of a chip and by attaching a substrate with conductive via holes to the other surface of the chip.

It is another object of the present invention to provide a chip package assembly, which is mounted on a printed circuit board by a innovative method according to the structure of the chip package.

It is a yet another object of the present invention to provide a method of manufacturing the chip package.

In accordance with one aspect of the present invention, the above and other objects can be accomplished by the provision of a chip package comprising a chip having a first surface provided with a first terminal and a second surface provided with at least one second terminal, the second surface being opposite to the first surface, a first conductive layer formed on the first surface of the chip, a second conductive layer formed on the second surface of the chip, and a substrate attached to the second surface of the chip and including at least one conductive via hole connected to the second terminal of the chip.

Preferably, a resin molding part formed along the outer wall of the chip mounted on the substrate may be further comprised. Further, preferably, a conductive layer may be formed on the upper and the lower surface of the substrate, and the upper and the lower conductive layers may be interconnected by the conductive via hole. The substrate may be a printed circuit board.

Further, preferably, the conductive via hole of the substrate may be formed on at least one side of the substrate in an approximately semicircular shape or on at least one corner of the substrate in an approximately quartered circular shape.

Moreover, preferably, the chip package may be applied to a diode element with two terminals or to a transistor element with three terminals. In case of the transistor element, the second surface of the chip may comprise two second terminals and the substrate may comprise two conductive via holes.

In accordance with another aspect of the present invention, there is provided a chip package assembly comprising a chip package and a printed circuit board. The chip package comprises a chip having a first conductive layer with a first terminal and a second conductive layer provided with at least one second terminal, the second conductive layer being opposite to the first conductive layer, and a substrate attached to the second conductive layer of the chip and including at least one conductive via hole connected to the second terminal of the chip. The printed circuit board comprises a plurality of signal patterns formed on the upper surface of the printed circuit board and connected to the terminals of the chip package, and a plurality of conductors for connecting the first conductive layer and the conductive via hole to the signal patterns. Herein, the chip package is vertically mounted on the upper surface of the printed circuit board so that the outer surfaces of the first conductive layer and the substrate become side surfaces.

Preferably, the conductor may be made of solder.

In accordance with yet another aspect of the present invention, there is provided a method of manufacturing a plurality of chip packages. The method comprises the steps of preparing a wafer having a plurality of chips spaced by a designated interval, preparing a substrate having a plurality of via holes spaced by the same interval as the chips, attaching the wafer to the upper surface of the substrate so that terminals formed on the lower surfaces of the chips are connected to the conductive via holes of the substrate, and sawing the chip assembly into a plurality of unit chip packages.

Preferably, a conductive layer may be formed on the upper and the lower surface of the substrate, and the upper and the lower conductive layers may be interconnected by the conductive via hole.

Further, preferably, the step of attaching the wafer to the upper surface of the substrate may comprise the sub-steps of coating the upper surfaces of the conductive via holes of the substrate with a conductive adhesive, and compressing the lower surface of the wafer on the upper surface of the substrate.

Moreover, preferably, the step of sawing the chip assembly into a plurality of unit chip packages may comprise the sub-steps of first-sawing the wafer into a plurality of chips, filling spaces between neighboring chips with resin, and second-sawing the chip assembly into a plurality of the chip packages. Herein, each of the first-sawing step and the second-sawing step is carried out by a designated blade. A blade used in the first-sawing step has a thickness less than that of a blade used in the second-sawing step.

BRIEF DESCRIPTION OF THE DRAWINGS

The above and other objects, features and other advantages of the present invention will be more clearly understood from the following detailed description taken in conjunction with the accompanying drawings, in which:

FIGS. 7a and 7b are schematic views, each illustrating a different shape of the via holes and the substrates using the via holes in accordance with yet another embodiment of the present invention.

DESCRIPTION OF THE PREFERRED EMBODIMENTS

Figure 1:
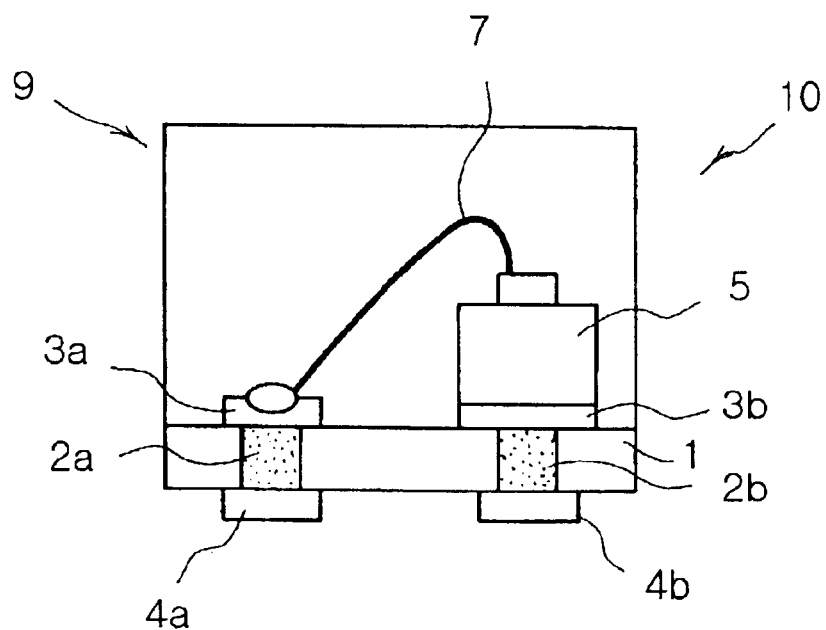
FIG. 1 is a cross-sectional view of a conventional chip package.
Figure 2:
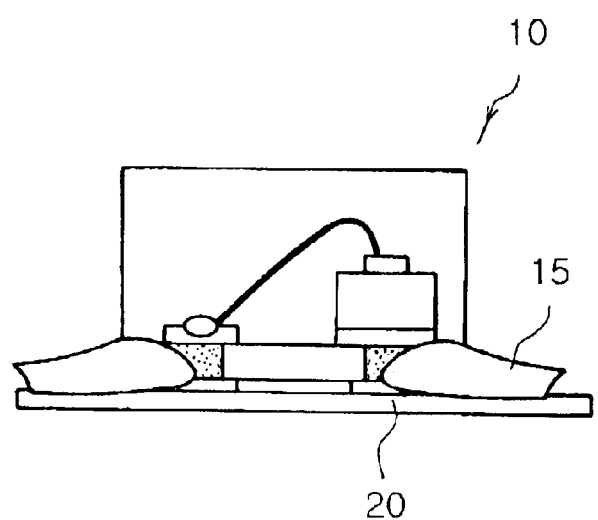
FIG. 2 is a schematic perspective view of a conventional chip package array.
Figure 3:
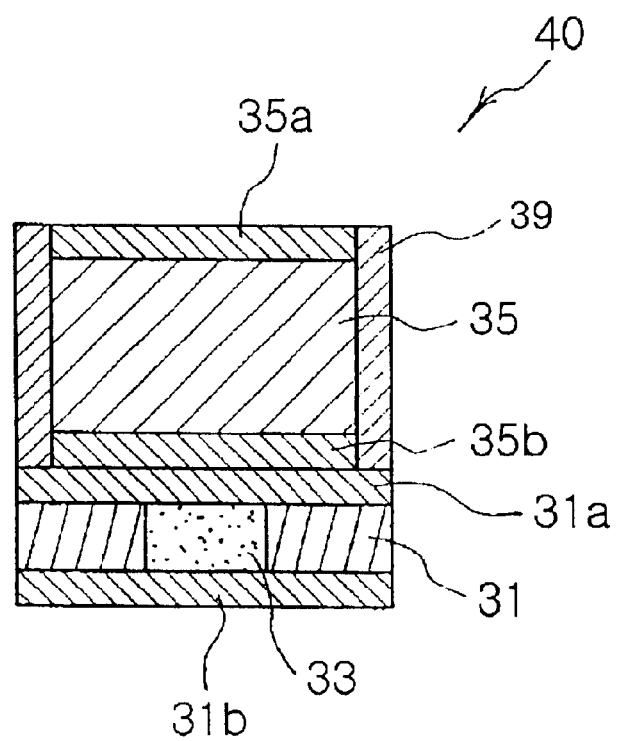
FIG. 3 is a perspective view of a chip package in accordance with an embodiment of the present invention.

FIG. 3 is a perspective view of a chip package in accordance with an embodiment of the present invention.

With reference to FIG. 3, the package 40 includes a chip 35 and a substrate 31 formed on the lower surface of the chip 35. The chip 35 includes a first terminal (not shown) formed on the upper surface and a second terminal (not shown) formed on the lower surface. The first terminal and the second terminal are generally opposite to each other. An upper conductive layer 35a is formed on the upper surface of the chip 35 with the first terminal, and a lower conductive layer 35b is formed on the lower surface of the chip 35 with the second terminal.

The chip 35 is attached to the upper surface of the substrate 31. A conductive via hole 33 is formed on the substrate 31. The lower conductive layer 35b formed on the lower surface of the chip 35 is electrically connected to an external device by the conductive via hole 33 of the substrate 31. The lower conductive layer 35b serves to more easily connect the terminal of the chip 35 to the substrate 31. The more exact connection of the terminal is achieved by adjusting the location and size of the conductive via hole 33. Herein, the conductive via hole 33 is filled with a conductive material so as to electrically connect the upper surface of the via holes 33 to the lower surface of the via hole 33.

In the same manner, preferably, an upper conductive layer 31a is formed on the upper surface of the substrate 31 and a lower conductive layer 31b is formed on the lower surface of the substrate 31. The upper and the lower conductive layers 31a, 31b of the substrate 31 serve to easily connect the terminal of the chip 35 to signal patterns of a printed circuit board in mounting the package including the chip 35 on the printed circuit board, as well as to effectively connect the terminal of the chip 35 to the conductive via hole 33 of the substrate 31.

In the chip package structure of FIG. 3, the terminal of the chip 35 is electrically connected to the external device through the conductive via hole 33. The location of the conductive via hole 33 is not limited, and will be further described in detail in FIG. 7.

The package 40 further includes a resin molding part 39 for protecting the side surface of the chip 35 from external stresses. Herein, resin (for example, epoxy resin etc) used as the resin molding part 39 is the same as that of the molding part of the conventional package.

The package 40 of this embodiment of the present invention does not need any wire requiring a large area. Further, since it is unnecessary to form at least two via holes and at least two conductive lands on a single ceramic substrate, an area for spacing the conductive lands is not required, thereby achieving a small-sized package, which is almost as much as the size of the chip.

Figure 4:
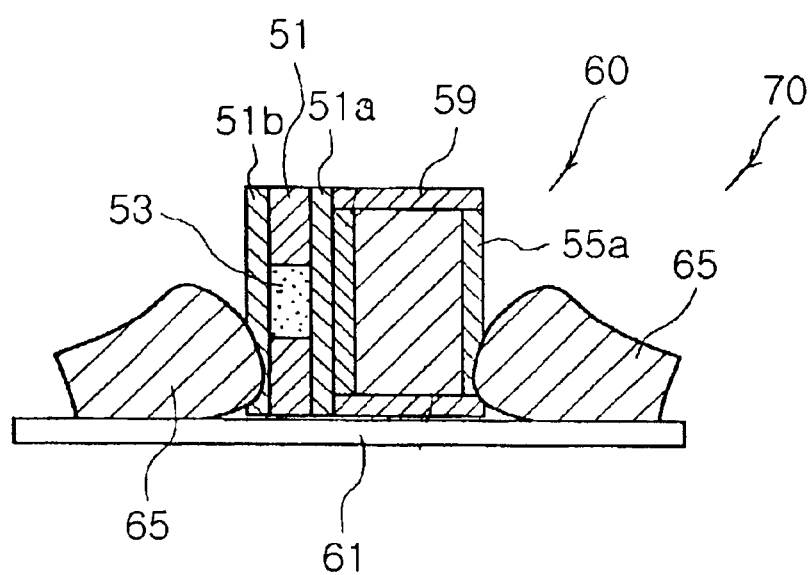
FIG. 4 is a schematic perspective view of a chip package array in accordance with an embodiment of the present invention.

These characteristics of the chip package of the present invention are more apparent by mounting the chip package on a printed circuit board. FIG. 4 is a schematic perspective view of a chip package array 70 in accordance with an embodiment of the present invention. The chip package 60 is mounted on a printed circuit board 61. Herein, the chip package assembly refers to an assembly including a chip package and the printed circuit board on which the chip package is mounted.

Differing from the conventional mounting method, in which the upper and the lower surfaces of the chip package with terminals are horizontal to the printed circuit board, the chip package 60 of the present invention is turned at an angle of 90 degrees and this turned chip package 60 is then mounted on the printed circuit boar 61. That is, as shown in FIG. 4, In order to electrically connect the terminal of the chip 55 to the signal patterns of the printed circuit board 61 through the conductive via hole 53 and the upper and the lower conductive layers 51a, 51b of the substrate 51 and the upper conductive layer 55a of the chip 55, the chip package 60 is vertically mounted on the printed circuit board 61 so that the outer surfaces of the substrate 51 and the upper conductive layer 55a of the chip 55 become side surfaces.

Herein, solder parts 65 for connecting the signal patterns corresponding to each terminal to the lower conductive layer 51b of the substrate 51 are formed on the printed circuit board 61.

The signal patterns of the printed circuit board 61 are connected to the terminals of the chip 35 within the chip package 60 by the solder parts 65.

In the chip package assembly of FIG. 4, in order to obtain a proper size of the chip package 60 being proper to the interval of the signal patterns, the size of the chip package 60 is changeable by adjusting the thickness of the substrate 51 attached to the lower surface of the chip package 60. Therefore, the chip package 60 of the present invention may be used without changing or modifying the signal patterns on the printed circuit board 61.

Figure 5:
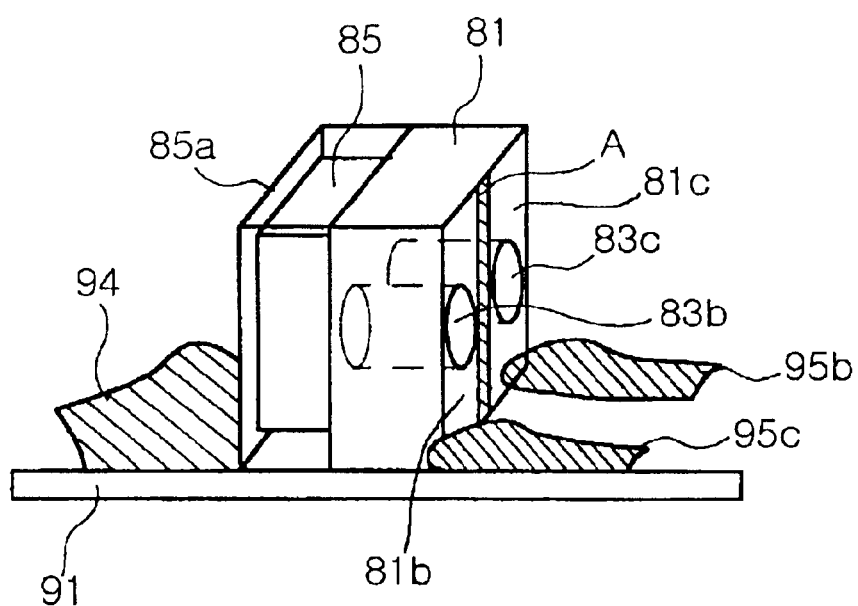
FIG. 5 is a schematic perspective view of a chip package array in accordance with another embodiment of the present invention.

FIG. 5 is a schematic perspective view of a chip package array in accordance with another embodiment of the present invention. The chip package array of this embodiment of the present invention is a transistor package array formed by packaging a transistor and mounting the packaged transistor on a printed circuit board 91. One terminal is formed on the upper surface of the transistor 85 and two terminals are formed on the lower surface of the transistor 85. Therefore, one upper terminal of the upper surface of the transistor 85 is connected to a signal pattern of the printed circuit board 91 through the upper conductive layer 85a by a solder part 94. On the other hand, since two lower terminals are formed on the lower surface of the transistor 85, an additional method of connecting two lower terminals to the printed circuit board 91 is required.

The lower surface of the transistor 85 with two separate lower terminals is attached to a substrate 81 provided with two conductive via holes 83b, 83c for connecting the upper and the lower surfaces of the substrate 81. A conductive layer is formed on the upper and the lower surfaces of the substrate 81 with two conductive via holes 83b, 83c. A non-conductive area A is formed on the upper and the lower conductive layers of the substrate 81 between the conductive via holes 83b, 83c, thereby connecting two separate lower terminals of the transistor 85 to the printed circuit board 91. Two conductive via holes 83b, 83c are connected to the wiring circuit of the printed circuit board 91 by the solder parts 95b, 95c through the conductive layers 81b, 81c of the lower surface of the substrate 81.

FIGS. 6a to 6e are cross-sectional views illustrating a method of manufacturing the chip package of the present invention.

Figure 6A:
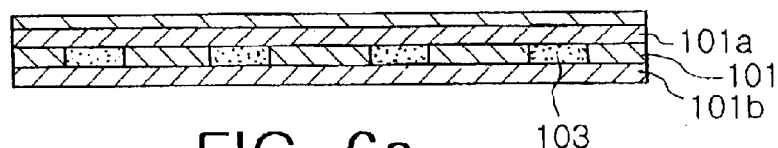
FIGS. 6a to 6e are cross-sectional views illustrating a method of manufacturing the chip package of the present invention.

As shown in FIG. 6a, the substrate 101 is prepared. A plurality of conductive via holes 103 are formed on the substrate 101 and spaced by a designated interval. The interval of the conductive via holes 103 is identical with an interval of chips formed on a wafer.

The upper conductive layer 101a is formed on the upper surface of the substrate 101 and the lower conductive layer 101b is formed on the lower surface of the substrate 101.

The upper conductive layer 101a serves to easily connect the terminal of the lower surface of the chip to the conductive via hole, and the lower conductive layer 101b serves to easily connect the conductive via hole to the signal pattern of the printed circuit board.

Figure 6B:
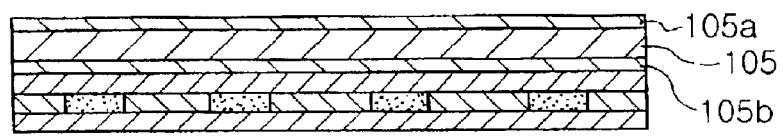

As shown in FIG. 6b, the wafer 105 including a plurality of the chips is attached to the upper surface of the substrate 101 by an adhesive. A conductive adhesive may be used as the adhesive. In case of using the conductive adhesive, a conductive layer formed on the upper surface of the substrate 101, i.e., the upper conductive layer 101a, may be omitted. Therefore, the conductive adhesive serves to mechanically fix the chip wafer 105 to the substrate 101 as well as to electrically connect the chip wafer 105 to the conductive via hole 103 of the substrate 101.

Figure 6C:
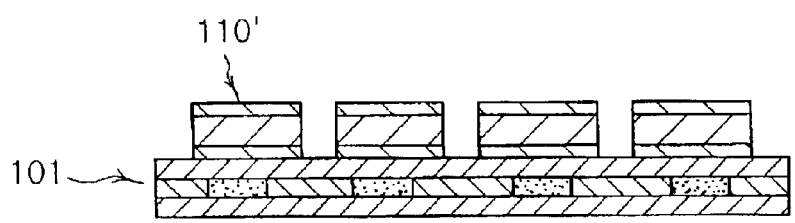
Figure 6D:
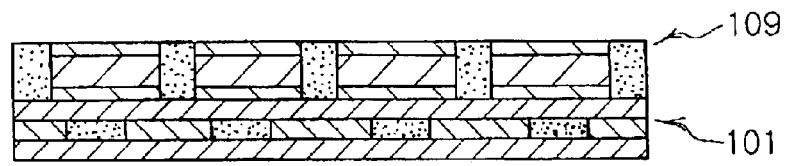

Then, as shown in FIG. 6c, the chip wafer 105 is sawed and cut into a plurality of individual chips 110'. Preferably, only the chip wafer 105 is sawed. That is, the substrate 101 attached to the lower surface of the chip wafer 105 is not sawed. As shown in FIG. 6d, spaces between the chips 110' are filled with a resin 109. This resin 109 filling the spaces between the chips 110' forms a resin molding part for protecting the side surface of the chip of a final package.

Figure 6E:
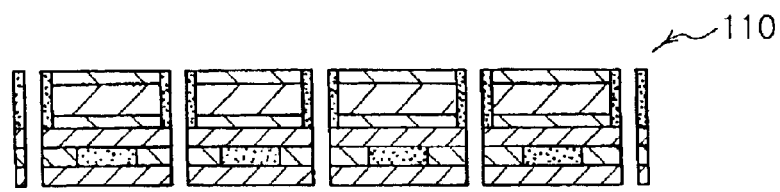

Then, as shown in FIG. 6e, the manufactured assembly is sawed and cut into a plurality of chip packages, thereby obtaining final chip packages. At this time, the substrate 101 including the upper and the lower conductive layers 101a, 101b is thoroughly sawed. Herein, the sawing width is so thin that a designated thickness of the resin 109 remains around the side surface of the chip. Therefore, a sawing blade used in the step of FIG. 6e has a thickness less than that of the sawing blade used in the step of FIG. 6c.

As described above, a plurality of the chip packages of the present invention may be easily manufactured using the substrate with the conductive via holes.

In the chip package of the present invention, the conductive via holes act to electrically connect the terminals of the chip to the signal patterns of the printed circuit board by the soldering. This conductive via hole is not limited in its shape, but may be variously shaped.

FIGS. 7a and 7b show various shapes of the via holes and the substrates using the via holes, which can be used on the chip packages 210, 220 of the present invention.

As shown in FIG. 7a, a conductive via hole 213 is formed at each corner of the substrate 211. These conductive via holes 213 are obtained by forming initial via holes 213' on a crossing area of scribe lines of an initial substrate 211', in forming the initial via hole 213' on the initial substrate 211'. After sawing the initial substrate 211' of FIG. 7a into a plurality of unit substrates 211, 4 quartered circular-shaped via holes 213 are formed at each corner of a single substrate 211. Two quartered circular-shaped via holes 213 may be formed at two corners of the same side of the substrate 211 and this side with two quartered circular-shaped conductive via holes 213 may be mounted on the printed circuit board.

As shown in FIG. 7b, a conductive via hole 223 is formed at two opposite sides of substrate 221. These conductive via holes 223 are obtained by forming an initial via hole 223' on a central area of scribe lines of an initial substrate 221', in forming the initial via hole 223' on the initial substrate 221'. After sawing the initial substrate 221' of FIG. 7b into a plurality of unit substrates 221, 2 semicircular-shaped via holes 223 are formed at two opposite sides of a single substrate 221. One semicircular-shaped via hole 223 may be formed at a side of the substrate 221 and this side with a semicircular-shaped conductive via hole 223 may be mounted on the printed circuit board.

In case of using the conductive via holes of FIGS. 7a and 7b, when the manufactured chip package is turned at an angle of 90 degrees and the turned chip package is mounted on the printed circuit board, the conductive via holes can be close to the surface of the printed circuit board, thereby more easily connecting these conductive via holes of FIGS. 7a and 7b to the signal patterns of the printed circuit board by the soldering step.

As apparent from the above description, in accordance with the present invention, the chip package is more miniaturized and a manufacturing method of the chip package is more simplified by forming a conductive layer on one surface of a chip and by attaching a substrate with conductive via holes to the other surface of the chip. Further, the reliability of the chip package can be improved, thereby manufacturing a more stable package.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A chip package assembly comprising:
    a chip package comprising:
        a chip having a first conductive layer with a first terminal, a second conductive layer provided with at least one second terminal and a side wall placed between the first surface and the second surface, the second conductive layer being opposite to the first conductive layer; and
        a substrate attached to the second conductive layer of said chip and including at least one conductive via hole connected to said second terminal of the chip; and
    a printed circuit board comprising:
        a plurality of signal patterns formed on the upper surface of the printed circuit board and connected to said terminals of the chip package; and
        a plurality of conductors for connecting said first conductive layer and said conductive via hole to said signal patterns,
    wherein said chip package is vertically mounted on the upper surface of said printed circuit board so that outer surfaces of said first conductive layer and said substrate become side surfaces.

2. The chip package assembly as set forth in claim 1, further comprising a resin molding part formed along the side wall of said chip mounted on the substrate.

3. The chip package as set forth in claim 1, wherein a conductive layer is formed on the upper and the lower surface of said substrate, and the upper and the lower conductive layers are interconnected by said conductive via hole.

4. The chip package assembly as set forth in claim 1, wherein said chip package has a hexahedral shape.

5. The chip package assembly as set forth in claim 1, wherein said conductive via hole of said substrate is formed on at least one side of the substrate in an approximately semicircular shape.

6. The chip package assembly as set forth in claim 1, wherein said conductive via hole of said substrate is formed on at least one corner of the substrate in an approximately quartered-circular shape.

7. The chip package assembly as set forth in claim 1, wherein said chip is a diode element, and wherein said second surface of the chip comprises one second terminal and said substrate comprises one conductive via hole.

8. The chip package assembly as set forth in claim 1, wherein said chip is a transistor element, and wherein said second surface of the chip comprises two second terminals and said substrate comprises two conductive via holes.

* * * * *